(12) United States Patent
Orui et al.

(10) Patent No.: US 6,428,329 B2
(45) Date of Patent: Aug. 6, 2002

(54) INTERPOSITION STRUCTURE BETWEEN SUBSTRATES

(75) Inventors: Kazuya Orui; Yasuhiro Nagashima; Toshiaki Harigaya, all of Kawasaki; Manabu Shimizu; Chiharu Nunokawa, both of Tokyo, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/753,986

(22) Filed: Jan. 3, 2001

(30) Foreign Application Priority Data

Apr. 17, 2000 (JP) ......................................... 2000-115204

(51) Int. Cl.[7] .................................................. H01R 4/58
(52) U.S. Cl. .......................... 439/75; 439/65; 439/751; 439/82
(58) Field of Search .............................. 439/66, 91, 74, 439/71, 75, 72, 581, 79, 65, 751, 82; 29/830, 812, 883

(56) References Cited

U.S. PATENT DOCUMENTS 5,400,504 A * 3/1995 Neumann et al. ............. 29/883
6,129,555 A * 10/2000 Daikuhara et al. ............ 439/60

FOREIGN PATENT DOCUMENTS

| JP | 58-172880 | 10/1983 |
| JP | 60-227372 | 11/1985 |
| JP | 63-301473 | 12/1988 |
| JP | 1-208894 | 8/1989 |
| JP | 4-261087 | 9/1992 |
| JP | 8-185911 | 7/1996 |

* cited by examiner

Primary Examiner—Tho D. Ta
Assistant Examiner—Phuongchi Nguyen
(74) Attorney, Agent, or Firm—Katten Muchin Zavis Rosenman

(57) ABSTRACT

An interposition structure interposed between substrates and capable of guiding the insertion of a connection pin for electrically connecting the substrates to each other, whereby the connection pin can be inserted properly even in cases where the substrates to be connected or other members have a dimensional error caused during production thereof, a positioning error or the like. The interposition structure has an interposition body in which a through hole is formed such that connection pin inlet and outlet portions thereof each have an inner diameter gradually increasing in a direction from the inner part to the corresponding outer open end thereof, and also has a positioning protuberance provided on the underside of the interposition body. The interposition structure is interposed between upper and lower substrates with the positioning protuberance received in a recess formed in the upper surface of the lower substrate, and the connection pin is inserted through a hole in the upper substrate, the through hole, and a hole in the lower substrate.

6 Claims, 19 Drawing Sheets

INTERPOSITION STRUCTURE BETWEEN SUBSTRATES

BACKGROUND OF THE INVENTION (1) Field of the Invention

The present invention relates to an interposition structure interposed between substrates, and more particularly, to such an interposition structure capable of guiding the insertion of connection pins for electrically connecting the substrates to each other.

(2) Description of the Related Art

With the recent tendency toward higher-density, higher-speed transfer of signals, multilayer substrates have come to be generally used as back panels for computers, servers, exchanges, etc. In cases where a back panel is constituted by a multilayer substrate, however, as the number of layers increases, more restrictions are imposed on the substrate design, making it difficult to freely configure the substrate, as in the arrangement of through holes.

To solve the problem, a method has been proposed in which the back panel is divided into two substrates and the substrates are interconnected by electrically conductive connection pins. FIG. 19 illustrates, in section, such substrates interconnected by a connection pin.

According to the method, an interposition structure 101 having a through hole 101a therein is interposed between upper and lower substrates 102 and 103 constituting a back panel, as shown in FIG. 19, and a conductive connection pin 104 is inserted into the through hole 101a from above the upper substrate 102 toward the lower substrate 103, thereby electrically connecting the upper and lower substrates 102 and 103.

With the conventional method shown in FIG. 19, however, to permit the connection pin 104 to be inserted properly, it is necessary that the holes cut in the upper and lower substrates 102 and 103 and the through hole 101a, through which the connection pin 104 is inserted, should be positioned in a straight line with high accuracy. Practical difficulty therefore arises in the insertion of the connection pin 104, on account of dimensional errors of the upper and lower substrates 102 and 103 and the interposition structure 101 caused during the production thereof, positioning errors, etc.

SUMMARY OF THE INVENTION

The present invention was created in view of the above circumstances, and an object thereof is to provide an interposition structure which is interposed between substrates and permits connection pins to be inserted properly even in cases where substrates to be connected or other members have dimensional errors caused during production thereof, positioning errors, etc.

To achieve the object, there is provided an interposition structure which is interposed between substrates and capable of guiding insertion of a connection pin for electrically connecting the substrates to each other. The interposition structure comprises an interposition body made of an insulating material and having a through hole through which the connection pin is inserted, and a positioning protuberance extending outward from the interposition body and received in a recess formed in one of the substrates, wherein an opening of the through hole has a connection pin inlet portion from which the connection pin is inserted, and the connection pin inlet portion is formed such that an inner diameter thereof gradually increases in a direction from an inner part toward an outer open end of the through hole.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 4(a), 4(b) and 4(c) show the shape of a connection pin inserted through holes in upper and lower substrates and a through hole positioned in alignment, wherein FIG. 4(a) is a front view of the connection pin, FIG. 4(b) is an enlarged sectional view taken along line B—B in FIG. 4(a), and FIG. 4(c) is an enlarged sectional view taken along line C—C in FIG. 4(a);

FIGS. 5(a), 5(b) and 5(c) show the structure of a connector, wherein FIG. 5(a) is a front view of the connector, FIG. 5(b) is a side view of the connector, and FIG. 5(c) is a bottom view of the connector;

DESCRIPTION OF THE PREFERRED EMBODIMENTS

Embodiments of the present invention will be hereinafter described with reference to the drawings.

A first embodiment of the present invention will be described first.

Figure 1:
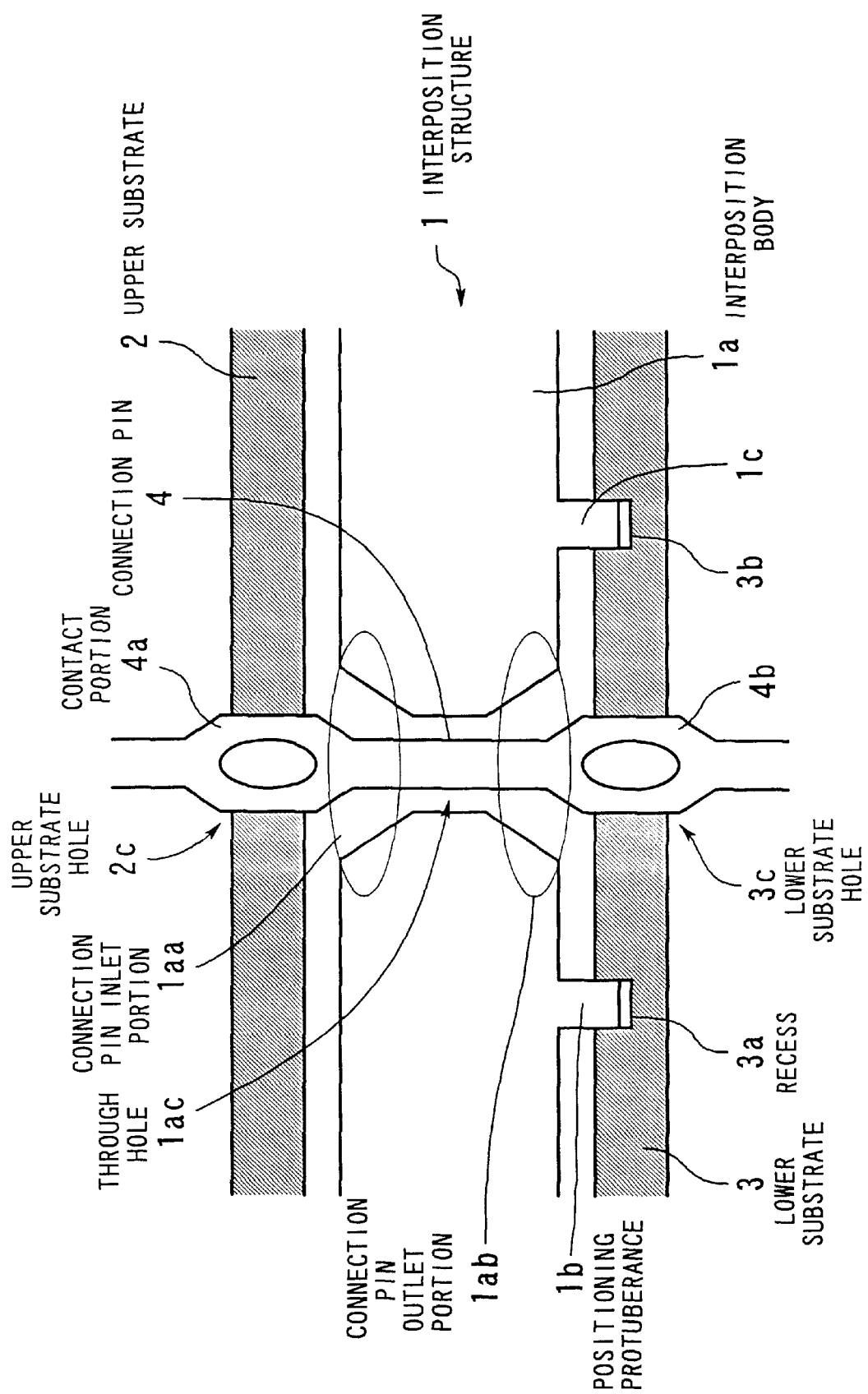
FIG. 1 is sectional view showing the connection of upper and lower substrates with the use of an interposition structure.
Figure 2:
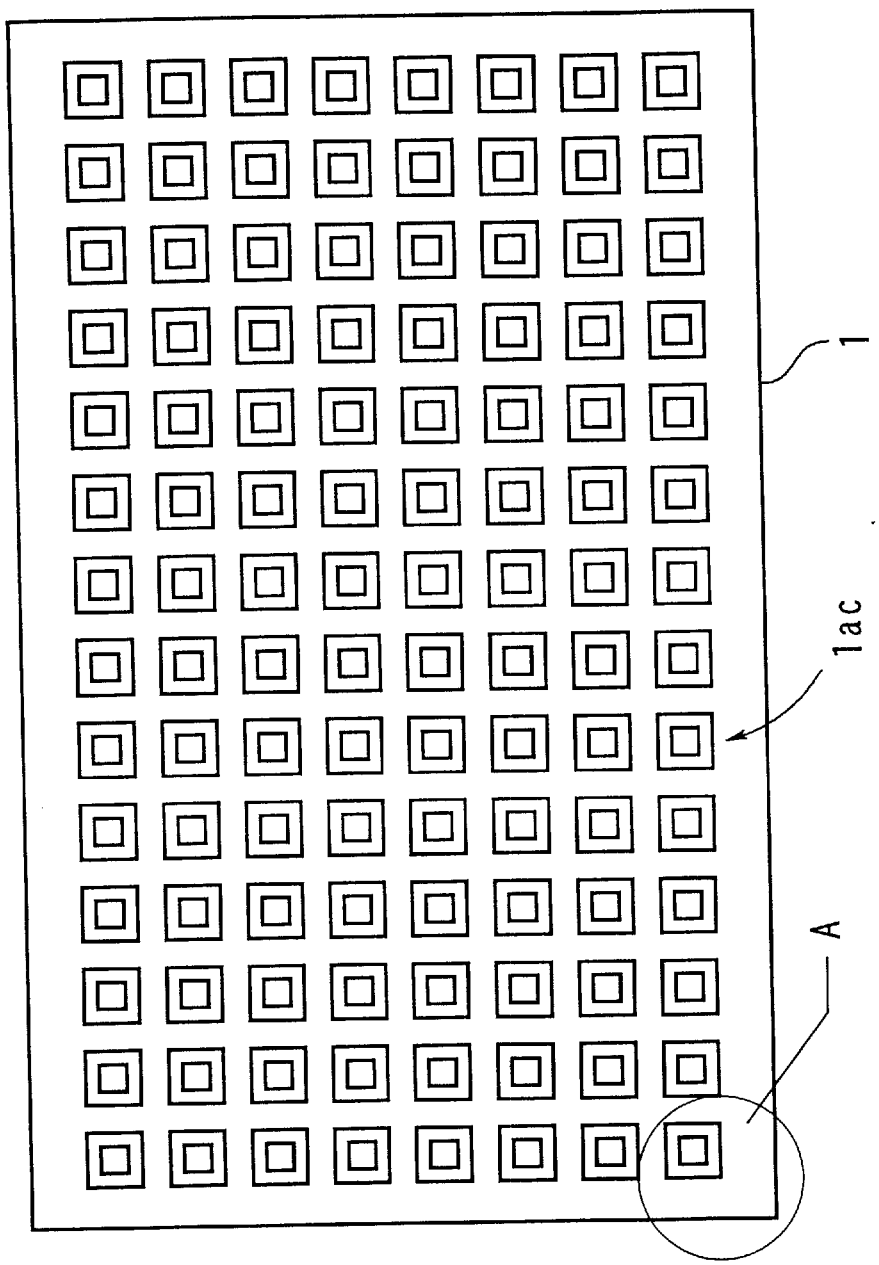
FIG. 2 is a plan view of a whole interposition body.
Figure 3:
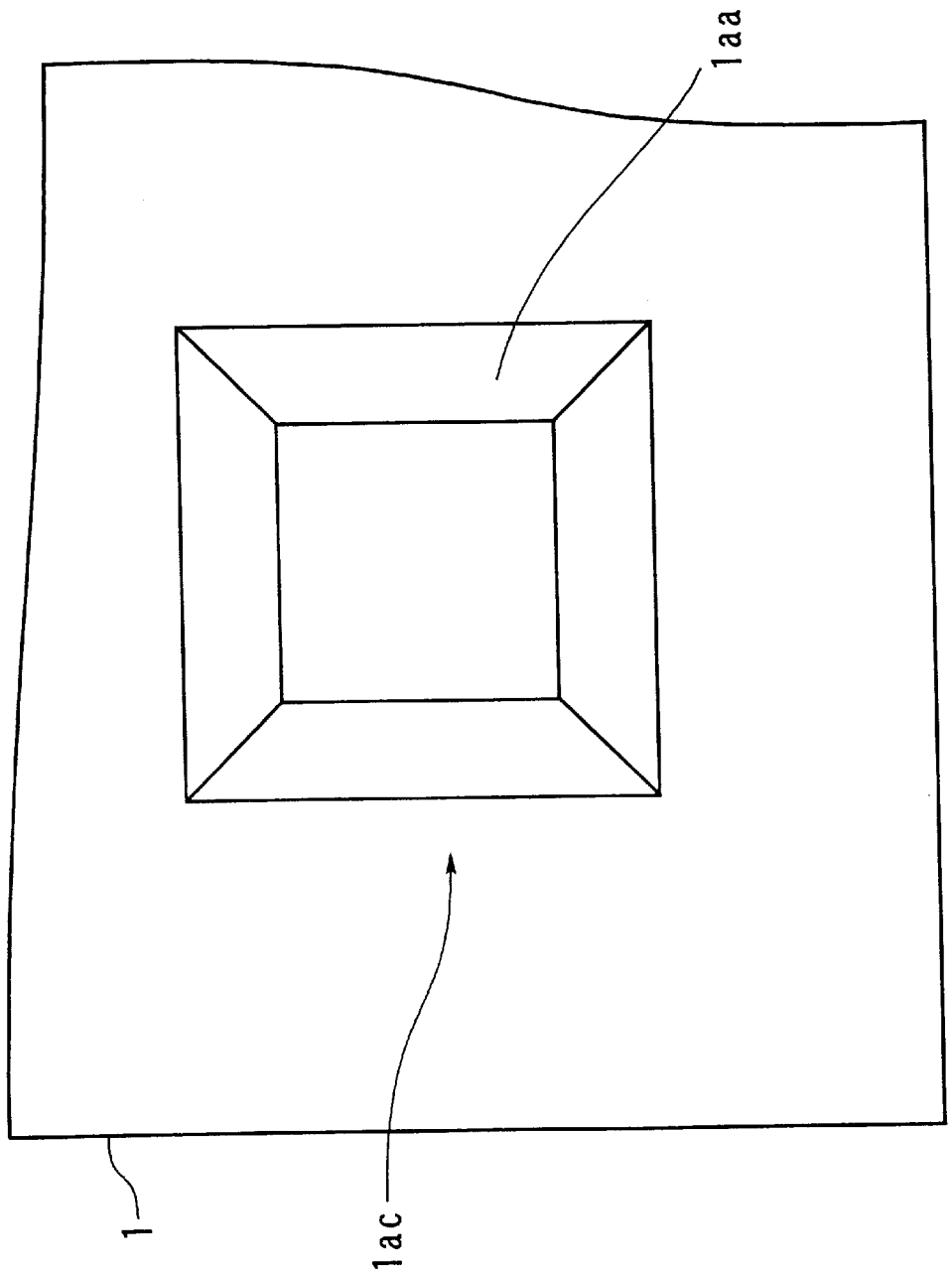
FIG. 3 is an enlarged view showing part A in FIG. 2.

FIG. 1 is a sectional view showing the connection of upper and lower substrates 2 and 3 with the use of an interposition structure 1 according to this embodiment, FIG. 2 is a plan view of a whole interposition body 1a, and FIG. 3 is an enlarged view of part A shown in FIG. 2.

The interposition structure 1 comprises an interposition body 1a having a through hole lac through which a connection pin 4 is inserted, and positioning protuberances 1b and 1c extending outward from the interposition body 1a and received in respective recesses 3a and 3b formed in the substrate.

The interposition body 1a is made of an insulating material such as LCP (Liquid Crystal Polymer), PBT (Polybutyleneterephthalate) or the like, and is formed like a plate as shown in FIG. 2. The plate-like interposition body 1a has a plurality of through holes 1ac formed therein so as to extend from the upper to the lower surface thereof. The opening of each through hole 1ac has a connection pin inlet portion 1aa from which the connection pin 4 is inserted, and a connection pin outlet portion 1ab from which the connection pin 4 is projected to the outside. The connection pin inlet and outlet portions 1aa and 1ab are each formed such that their inner diameter gradually increases in a direction from the inner part toward the corresponding outer open end of the through hole 1ac, and thus have inner diameters greater than that of the central portion of the through hole 1ac.

The central portion of the through hole 1ac is narrowed to an extent such that the connection pin 4 can pass therethrough. By thus narrowing the central portion of the through hole 1ac, it is possible to lessen the bend of the connection pin 4 when the pin 4 is inserted.

Also, as shown in FIGS. 2 and 3, the interposition body 1a is punched to form square through holes 1ac, so that each through hole 1ac has a square sectional form in a plane perpendicular to the direction in which the through hole extends. In the illustrated example, square through holes 1ac are punched in the interposition body 1a, but through holes 1ac of some other polygonal shape, circular shape, etc. may be punched in the interposition body 1a, or through holes 1ac of different punching shapes may be combined.

The positioning protuberances 1b and 1c, which include a plurality of projections formed on the underside of the interposition body 1a, are not particularly limited in shape and may be in the form of rectangular parallelepiped, cylinder, semicylinder, etc.; preferably, however, the shape of the protuberances should be such that the protuberances permit the interposition body 1a to be properly fixed in position when received in the respective recesses 3a and 3b. The material of the positioning protuberances 1b and 1c also is not particularly limited and any material may be used insofar as it has a certain degree of mechanical strength and reliability. To form the positioning protuberances 1b and 1c, the interposition body 1a and the positioning protuberances 1b and 1c may be formed at the same time as a one-piece body or metallic pins made of metal may be attached to the underside of the interposition body 1a.

The upper and lower substrates 2 and 3 have respective holes 2c and 3c extending therethrough, and the aforementioned recesses 3a and 3b are formed in the upper surface of the lower substrate 3. The interposition structure 1 is interposed between the upper and lower substrates 2 and 3 constituting a backboard, with the positioning protuberances 1b and 1c thereof received in the respective recesses 3a and 3b. The positioning protuberances 1b and 1c of the interposition structure 1 are formed at locations such that when the protuberances are received in the recesses 3a and 3b, the through hole 1ac is located over the lower substrate hole 3c. Thus, when the positioning protuberances 1b and 1c are fitted in the recesses 3a and 3b, the lower substrate hole 3c and the through hole 1ac are positioned in the same straight line. Also, the upper substrate 2 is constructed such that the hole 2c formed therein is located in alignment with the lower substrate hole 3c and the through hole 1ac, and the conductive connection pin 4 is inserted through the upper and lower substrate holes 2c and 3c and the through hole 1ac thus positioned in the same straight line. The upper and lower substrate holes 2c and 3c each include a plurality of holes formed at locations corresponding to the respective through holes 1ac of the interposition structure 1 in alignment therewith. The connection pins 4 are inserted through respective sets of the upper and lower substrate holes 2c and 3c and through hole 1ac positioned in the same straight line.

Figure 4:
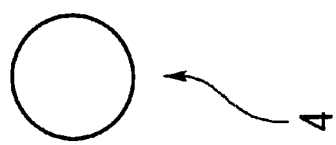
Figure 4:
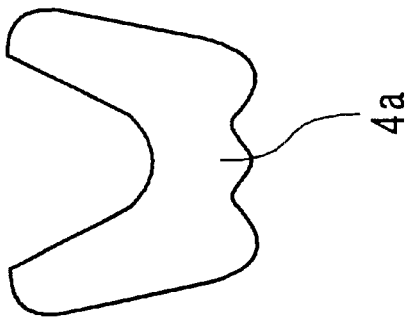
Figure 4:
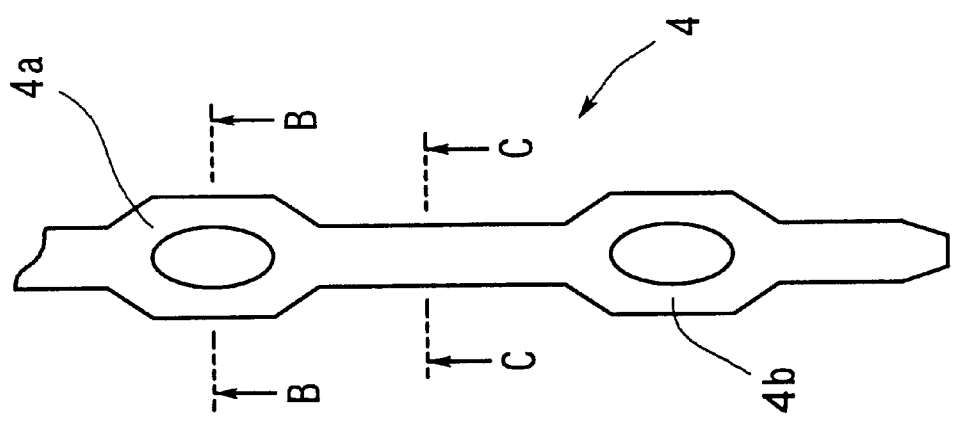

FIG. 4 illustrates the shape of the connection pin 4 inserted through the upper and lower substrate holes 2c and 3c and the through hole 1ac which are positioned in the same straight line as mentioned above. FIG. 4(a) is a front view of the connection pin 4, and FIGS. 4(b) and 4(c) are enlarged sectional views taken along lines B—B and C—C, respectively, in FIG. 4(a).

As shown in FIG. 4(b), a contact portion 4a of the connection pin 4 is generally U-shaped in section, and when the connection pin 4 is inserted through the upper and lower substrate holes 2c and 3c and the through hole 1ac, the generally U-shaped contact portion 4a is press-fitted into the hole 2c of the upper substrate 2, so that the connection pin 4 and the upper substrate 2 can be electrically connected to each other. A contact portion 4b also is generally U-shaped in section, like the contact portion 4a, and when the connection pin 4 is inserted, the contact portion 4b is press-fitted into the hole 3c of the lower substrate 3, whereby the connection pin 4 and the lower substrate 3 can be electrically connected to each other. In the illustrated example, the contact portions 4a and 4b have a generally U-shaped sectional form, but the sectional form is not particularly limited to such a U-shape and may be a desired shape insofar as it is suited for the press-fitting. Also, as shown in FIG. 4(c), a portion of the connection pin 4 between the contact portions 4a and 4b has a generally circular sectional form, but the sectional form is not particularly limited to circle and may be ellipse, polygon, etc. Further, the material of the connection pin 4 is not limited to phosphor bronze or the like, and any material may be used insofar as it has high electrical conductivity, high reliability and a certain degree of mechanical strength.

Figure 5:
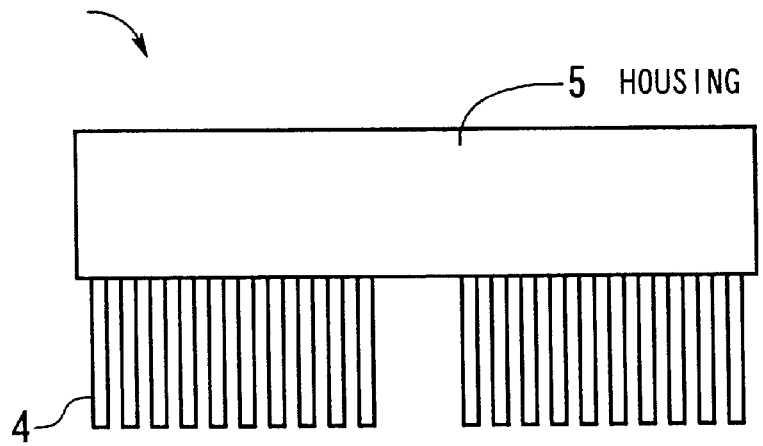
Figure 5:
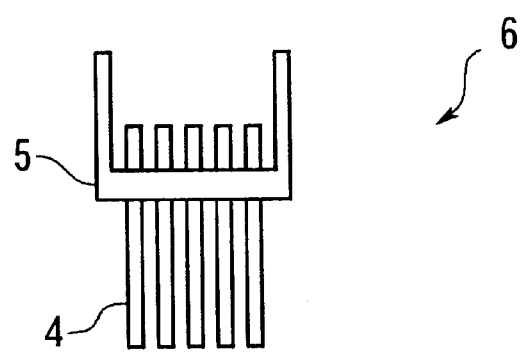
Figure 5:
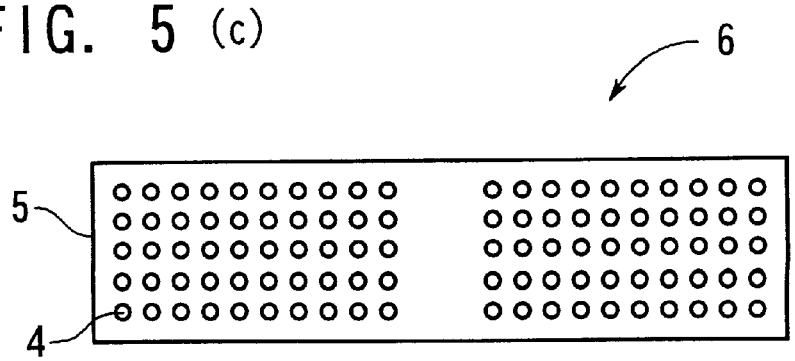

The connection pins 4 are attached, in the form of a plurality of bundles, to a housing, thereby constituting a connector. FIG. 5 illustrates the structure of such a connector 6, wherein FIGS. 5(a), 5(b) and 5(c) are a front view, side view and bottom view, respectively, of the connector 6.

As shown in FIG. 5, the connector 6 comprises a plurality of connection pins 4 attached to a housing 5 which is made of an insulating material such as PBT (Polybutyleneterephthalate). The connection pins 4 are arranged at locations corresponding to the respective through holes 1ac formed in the interposition structure 1 and are inserted through the respective sets of the upper and lower substrate holes 2c and 3c and through hole 1ac positioned in the same straight line.

The manner of how the connection pins 4 are inserted in the upper and lower substrates 2 and 3 with the interposition structure 1 interposed therebetween will be now described.

FIGS. 6 through 9 are sectional views illustrating the insertion of the connection pin 4 in the case where the upper substrate 2 is displaced.

Figure 6:
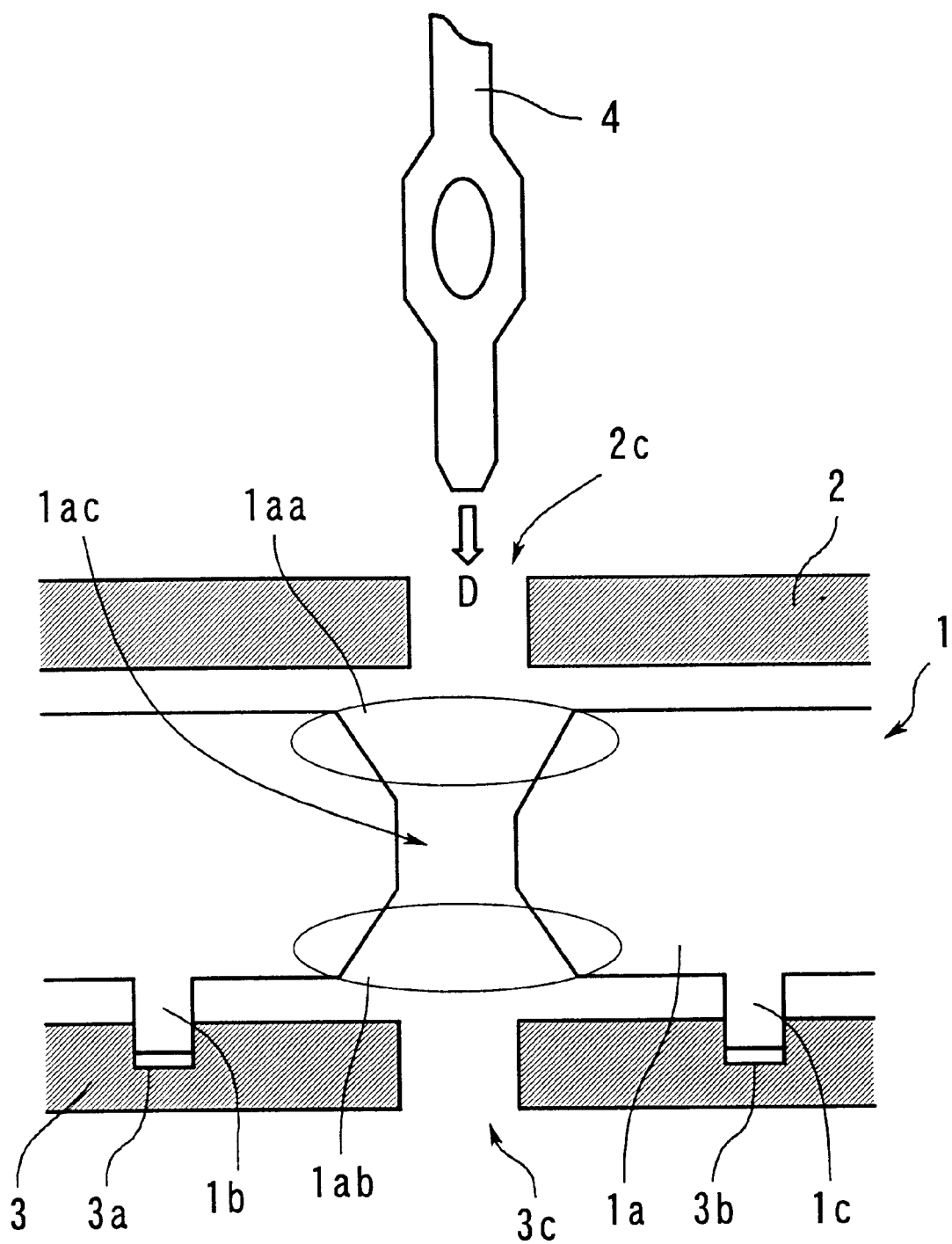
FIG. 6 is a sectional view showing how the connection pin is inserted in the case where the upper substrate is displaced.
Figure 7:
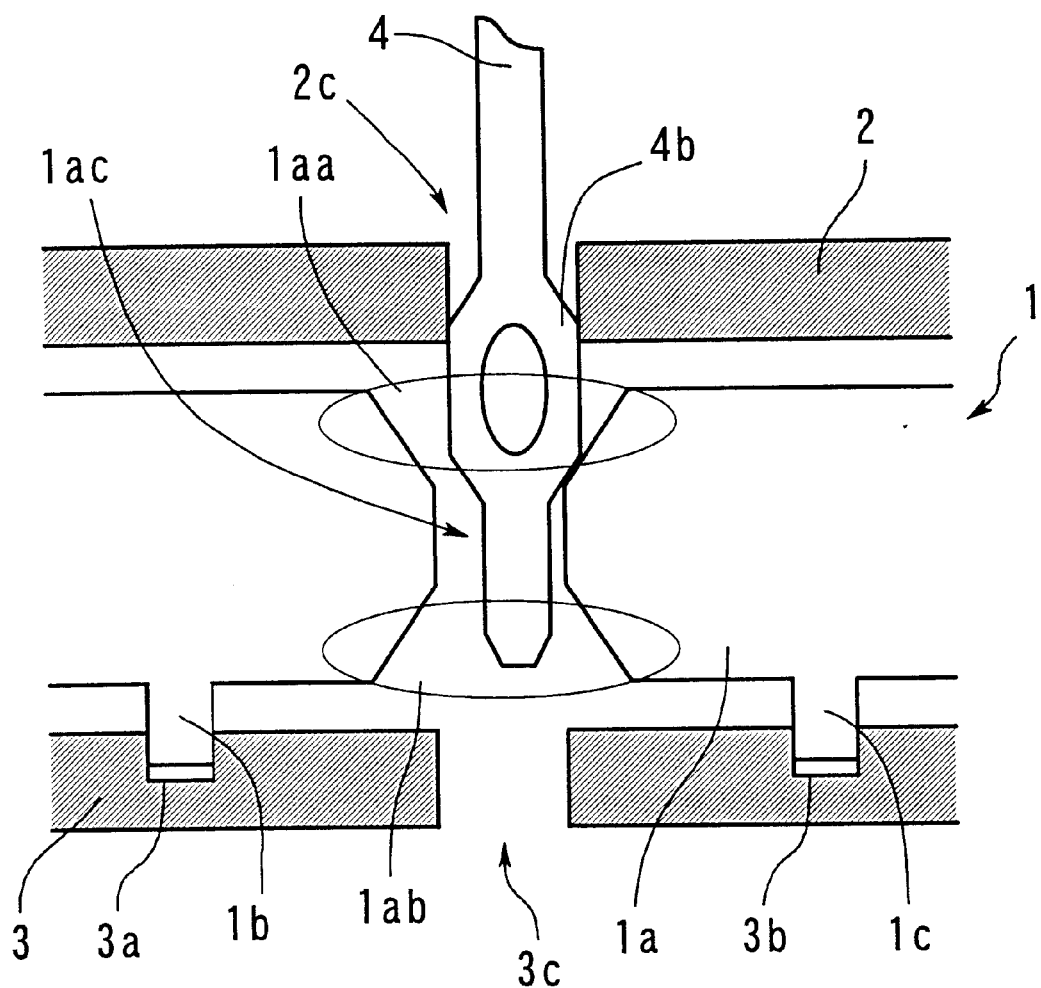
FIG. 7 is a sectional view showing how the connection pin is inserted in the case where the upper substrate is displaced.
Figure 8:
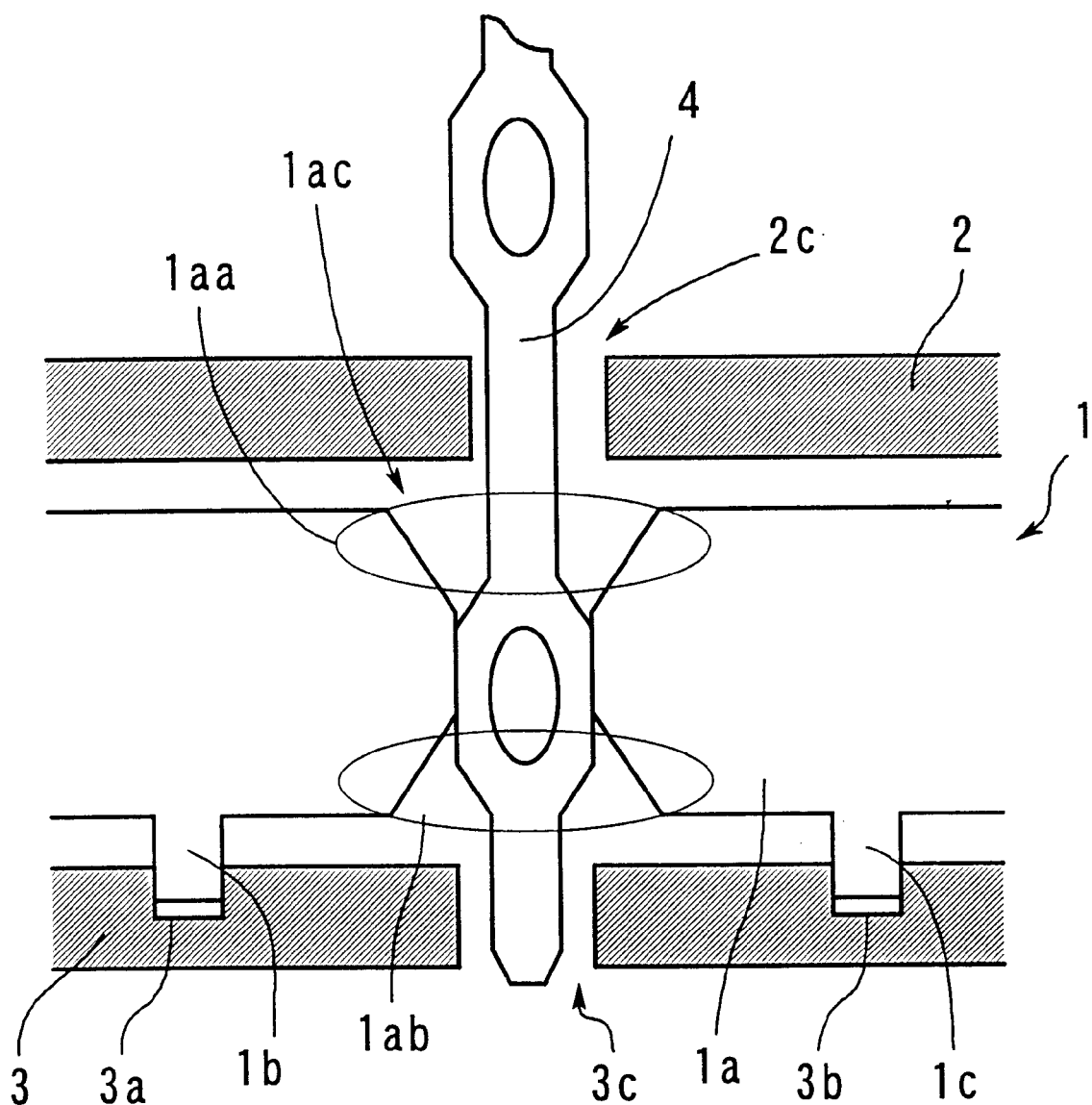
FIG. 8 is a sectional view showing how the connection pin is inserted in the case where the upper substrate is displaced.
Figure 9:
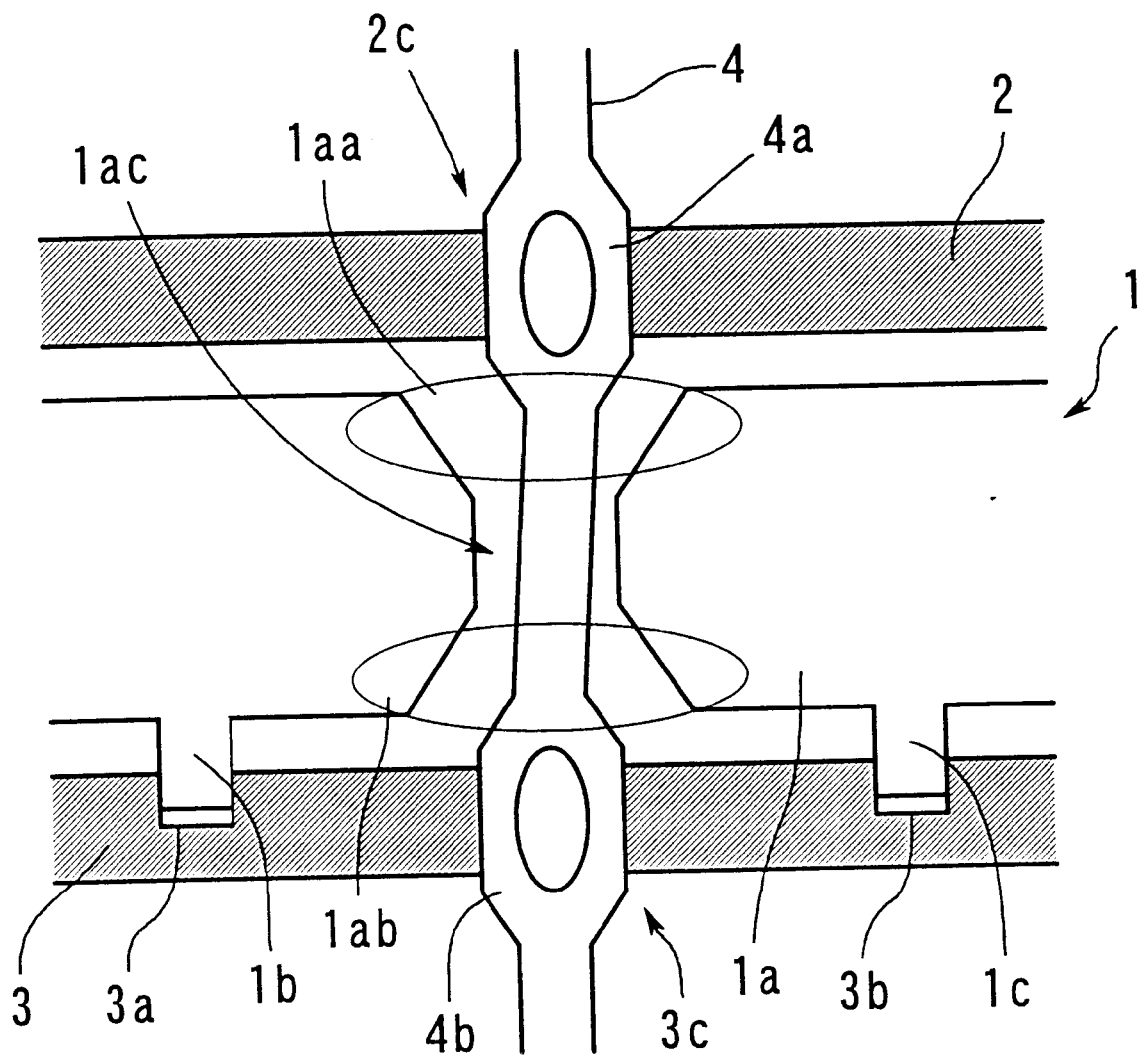
FIG. 9 is a sectional view showing how the connection pin is inserted in the case where the upper substrate is displaced.

The upper substrate 2 is displaced to the right as viewed in FIG. 6, and the hole 2c formed in the upper substrate 2 is also displaced correspondingly to the right as viewed in the figure. As the connection pin 4 is inserted into the hole 2c of the thus-displaced upper substrate in a direction D shown in FIG. 6, the pin 4 first comes into contact with the right-hand portion of the connection pin inlet portion 1aa, as viewed in FIG. 7. The connection pin inlet portion 1aa of the through hole 1ac is formed such that the inner diameter thereof gradually increases in a direction from the inner part toward the outer open end of the through hole 1ac, as mentioned above. Consequently, the connection pin 4 in contact with the connection pin inlet portion 1aa, as shown in FIG. 7, slides down toward the inner part of the through hole 1ac along the inner wall thereof and reaches a position near the center of the through hole 1ac, as shown in FIG. 8. As the connection pin 4 is further inserted thereafter, the contact portions 4a and 4b reach the upper and lower substrate holes 2c and 3c, respectively, and are press-fitted therein, as shown in FIG. 9, whereby the connection of the upper and lower substrates 2 and 3 is completed.

Thus, the connection pin inlet portion 1aa is formed such that the inner diameter thereof gradually increases in a direction from the inner part toward the outer open end of the through hole 1ac, and accordingly, even in cases where the upper substrate 2 is displaced, the connection pin inlet portion 1aa serves to guide the connection pin 4 toward the inner part of the through hole 1ac, whereby electrical connection of the upper and lower substrates 2 and 3 by means of the connection pin 4 can be achieved.

FIGS. 10 through 13 are sectional views illustrating how the connection pin 4 is inserted in the case where the lower substrate hole 3c, the positioning protuberances 1b and 1c, the recesses 3a and 3b or the like have a dimensional error caused during production.

Figure 10:
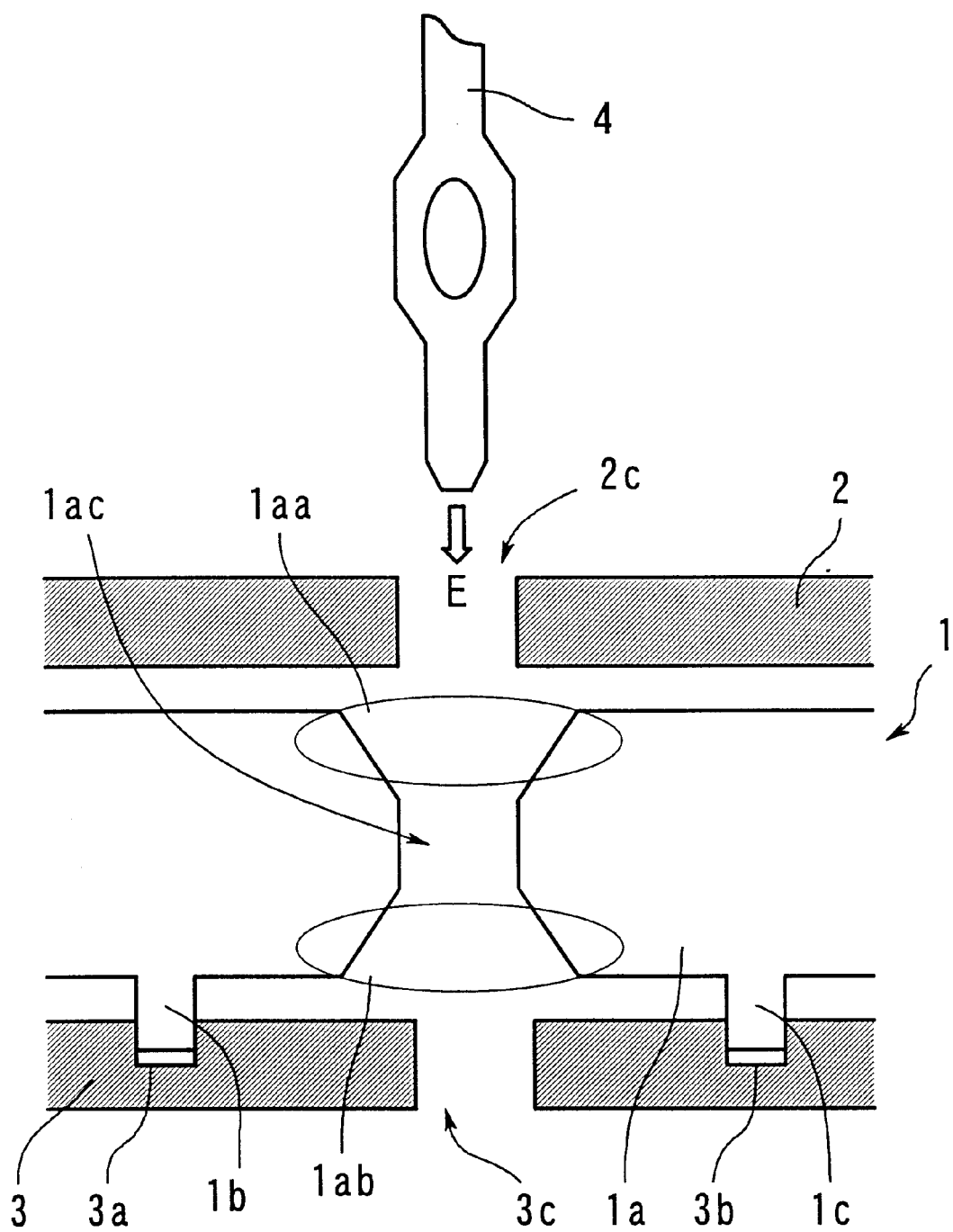
FIG. 10 is a sectional view showing how the connection pin is inserted in the case where a lower substrate hole, positioning protuberances, recesses or the like have a dimensional error caused during production thereof.
Figure 11:
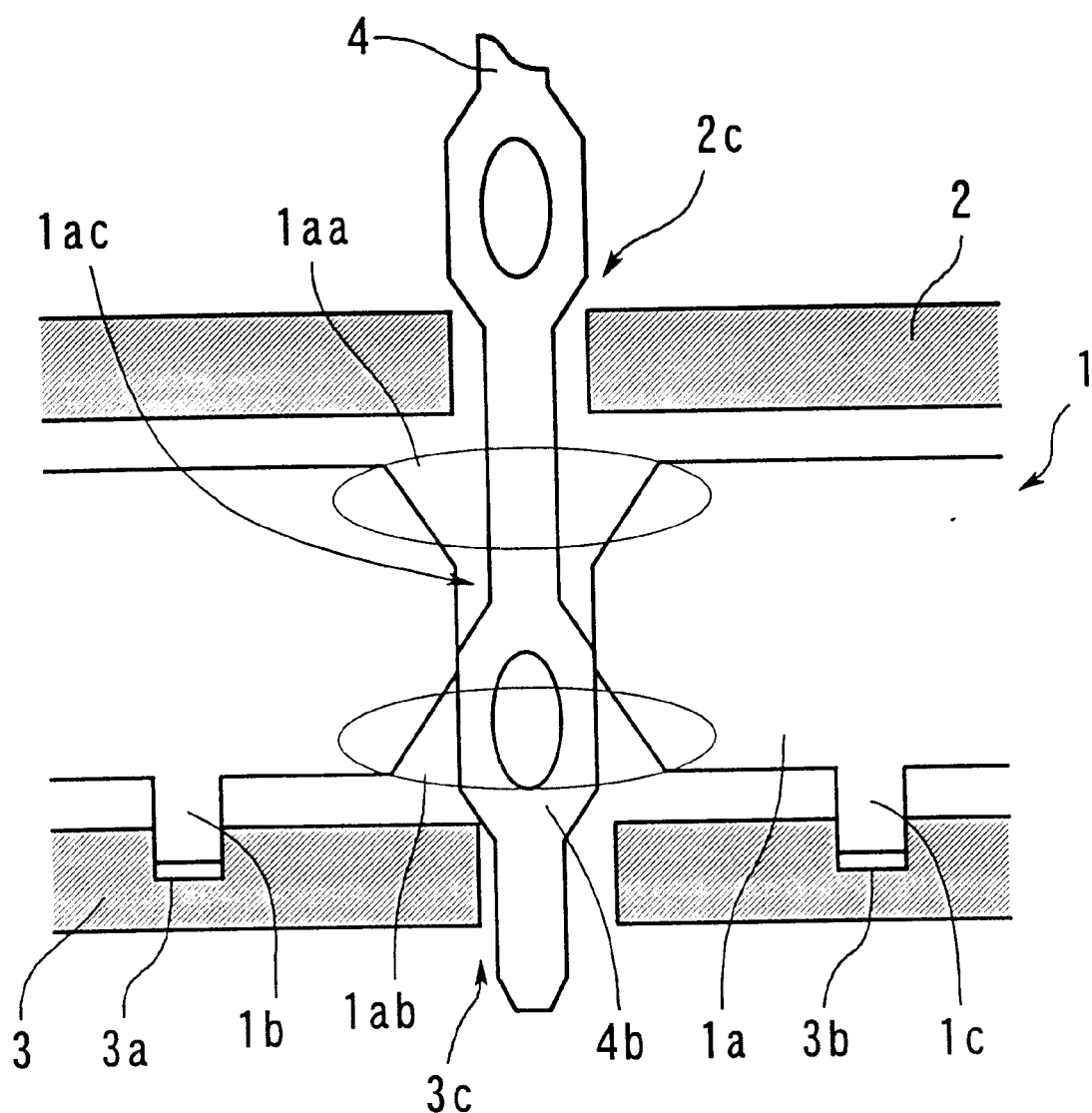
FIG. 11 is a sectional view showing how the connection pin is inserted in the case where the lower substrate hole, positioning protuberances, recesses or the like have a dimensional error caused during production thereof.
Figure 12:
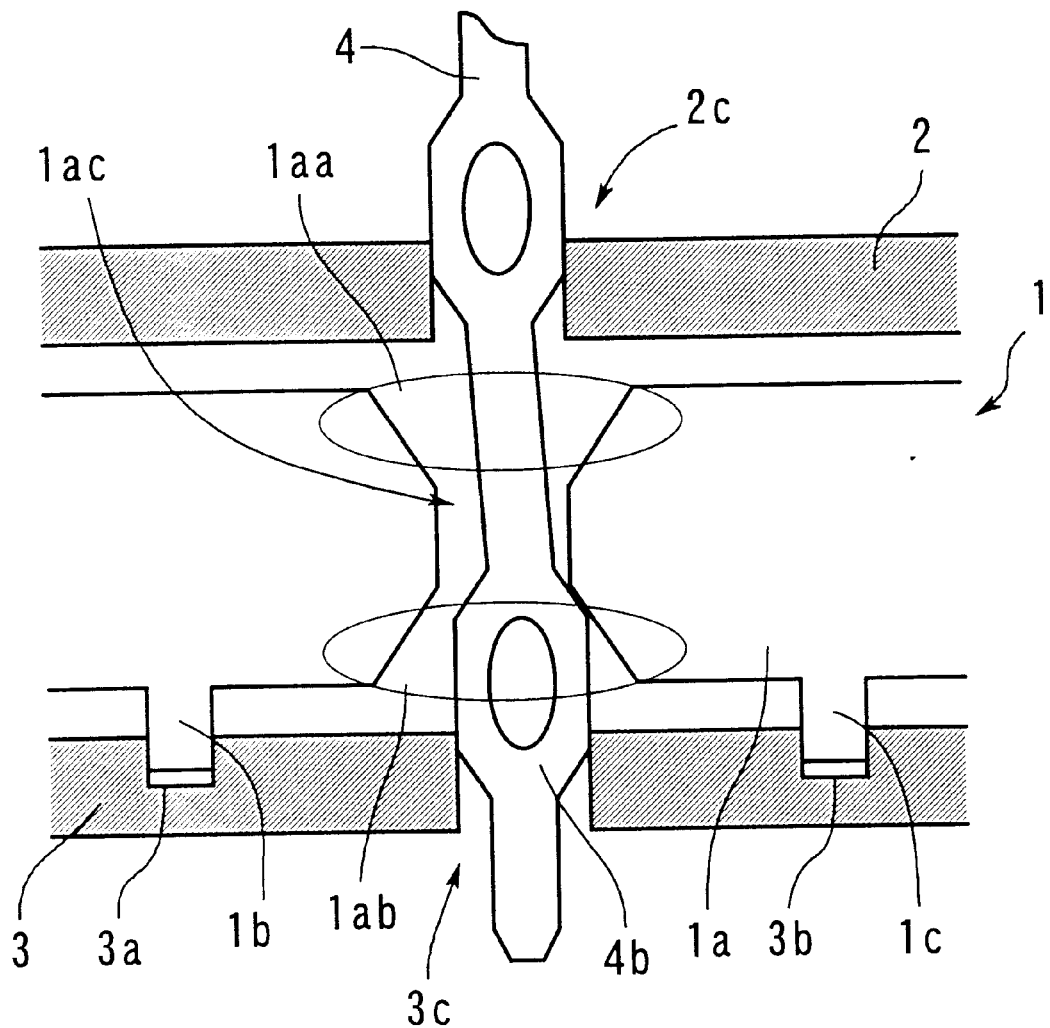
FIG. 12 is a sectional view showing how the connection pin is inserted in the case where the lower substrate hole, positioning protuberances, recesses or the like have a dimensional error caused during production thereof.
Figure 13:
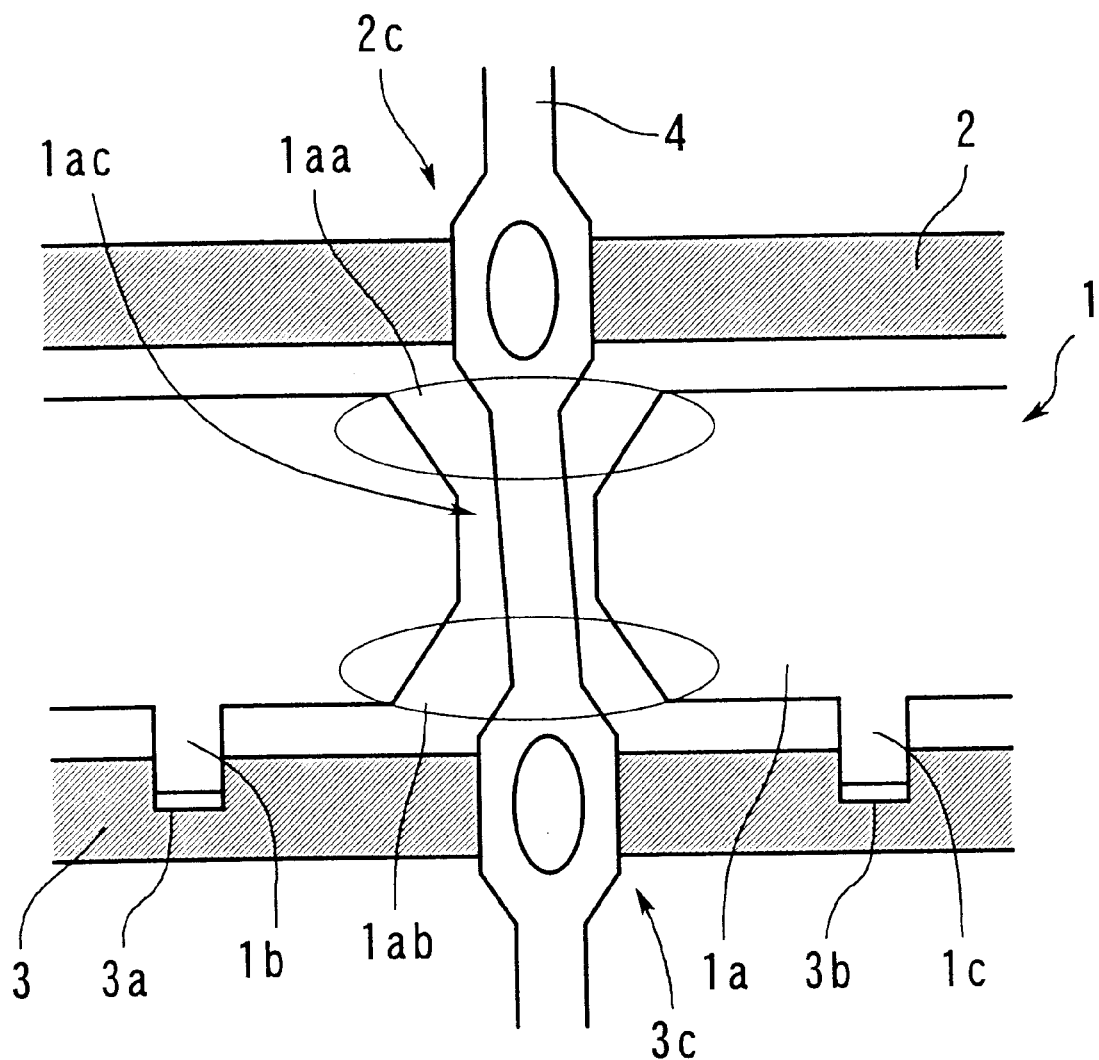
FIG. 13 is a sectional view showing how the connection pin is inserted in the case where the lower substrate hole, positioning protuberances, recesses or the like have a dimensional error caused during production thereof.

The lower substrate hole 3c is displaced to the right, as viewed in FIG. 10, due to a dimensional error caused during production. As the connection pin 4 is inserted into the upper substrate hole 2c in a direction E shown in FIG. 10, the pin 4 passes through the upper substrate hole 2c and the through hole 1ac and comes into contact with the left-hand edge portion of the hole 3c in the lower substrate 3, as viewed in FIG. 11. However, since the connection pin outlet portion 1ab of the through hole 1ac is formed such that the inner diameter thereof is greater than that of the central portion of the through hole 1ac, as mentioned above, the connection pin outlet portion 1ab provides enough space or room for the connection pin 4 to slide down toward the lower substrate hole 3c. Consequently, as the connection pin 4 is further inserted, it slides down into the lower substrate hole 3c, as shown in FIG. 12, and then is fitted therein, as shown in FIG. 13, thus achieving electrical connection of the upper and lower substrates 2 and 3.

Thus, the connection pin outlet portion 1ab is formed such that the inner diameter thereof is greater than that of the central portion of the through hole 1ac, and therefore, even in cases where the lower substrate hole 3c is displaced due to a dimensional error caused during production, the connection pin 4 is allowed to slide into such a displaced hole, making it possible to achieve electrical connection of the upper and lower substrates 2 and 3 by means of the connection pin 4.

As described above, according to this embodiment, the interposition structure 1 has the through hole 1ac formed in the interposition body 1a thereof such that the connection pin inlet and outlet portions 1aa and 1ab each have an inner diameter gradually increasing in a direction from the inner part toward the corresponding outer open end thereof, and also has the positioning protuberances 1b and 1c formed on the underside of the interposition body 1a. The interposition structure 1 is interposed between the upper and lower substrates 2 and 3 with the positioning protuberances 1b and 1c received in the respective recesses 3a and 3b formed in the upper surface of the lower substrate 3, and the connection pin 4 is inserted through the upper substrate hole 2c, the through hole 1ac and the lower substrate hole 3c. Consequently, even in cases where the upper and lower substrates 2 and 3 to be connected or other members have a dimensional error caused during production thereof, a positioning error or the like, the connection pins 4 can be inserted properly.

In the above description of the embodiment, two substrates, that is, the upper and lower substrates 2 and 3, are connected by the connection pins 4, but three or more substrates may alternatively be connected by the connection pins 4.

A second embodiment of the present invention will be now described.

This embodiment is a different form of application of the first embodiment and differs from the first embodiment in that the positioning protuberances are formed on both the upper and lower surfaces of the interposition structure 1. The following description will therefore be focused on the difference, and explanation of other parts identical with those of the first embodiment will be omitted.

Figure 14:
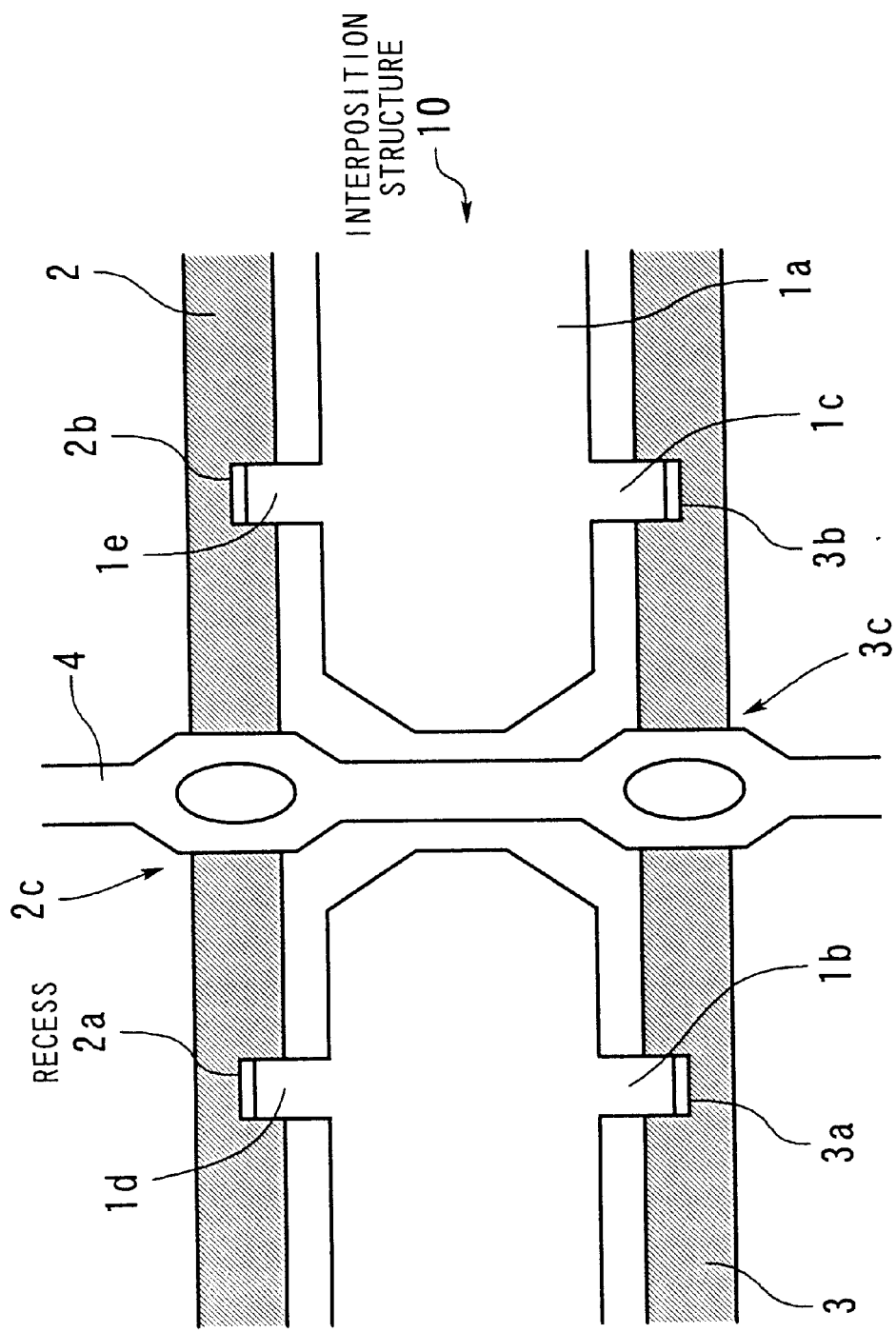
FIG. 14 is a sectional view showing the connection of the upper and lower substrates with the use of an interposition structure.

FIG. 14 is a sectional view illustrating the connection of the upper and lower substrates 2 and 3 with the use of an interposition structure 10 according to this embodiment.

In the interposition structure 10 of this embodiment, the interposition body 1a has not only the positioning protuberances formed on the lower surface thereof but also positioning protuberances 1d and 1e formed on the upper surface thereof, as mentioned above. Accordingly, recesses 2a and 2b associated with the positioning protuberances 1d and 1e are formed in the lower surface of the upper substrate 2, and the interposition structure 1 is interposed between the upper and lower substrates 2 and 3 with the positioning protuberances 1d and 1e received in the respective recesses 2a and 2b of the upper substrate 2 and also with the positioning protuberances 1b and 1c received in the respective recesses 3a and 3b of the lower substrate 3. The positioning protuberances 1d and 1e are formed on the upper surface of the interposition body 1a at locations such that when the protuberances are received in the respective recesses 2a and 2b, the through hole 1ac is located under the upper substrate hole 2c. Consequently, when the positioning protuberances 1d and 1e are fitted in the respective recesses 2a and 2b of the upper substrate 2 and the positioning protuberances 1b and 1c are fitted in the respective recesses 3a and 3b of the lower substrate 3, the upper and lower substrate holes 2c and 3c and the through hole 1ac are positioned in the same straight line.

Thus, in this embodiment, the upper surface of the interposition body 1a also has the positioning protuberances 1d and 1e formed thereon, and accordingly, the alignment of the upper and lower substrate holes 2c and 3c and the through hole 1ac is facilitated, making it easier to insert the connection pins 4.

A third embodiment of the present invention will be now described.

This embodiment is a modification of the first embodiment and differs from the first embodiment in the form of the connection pin outlet portion 1ab.

Figure 15:
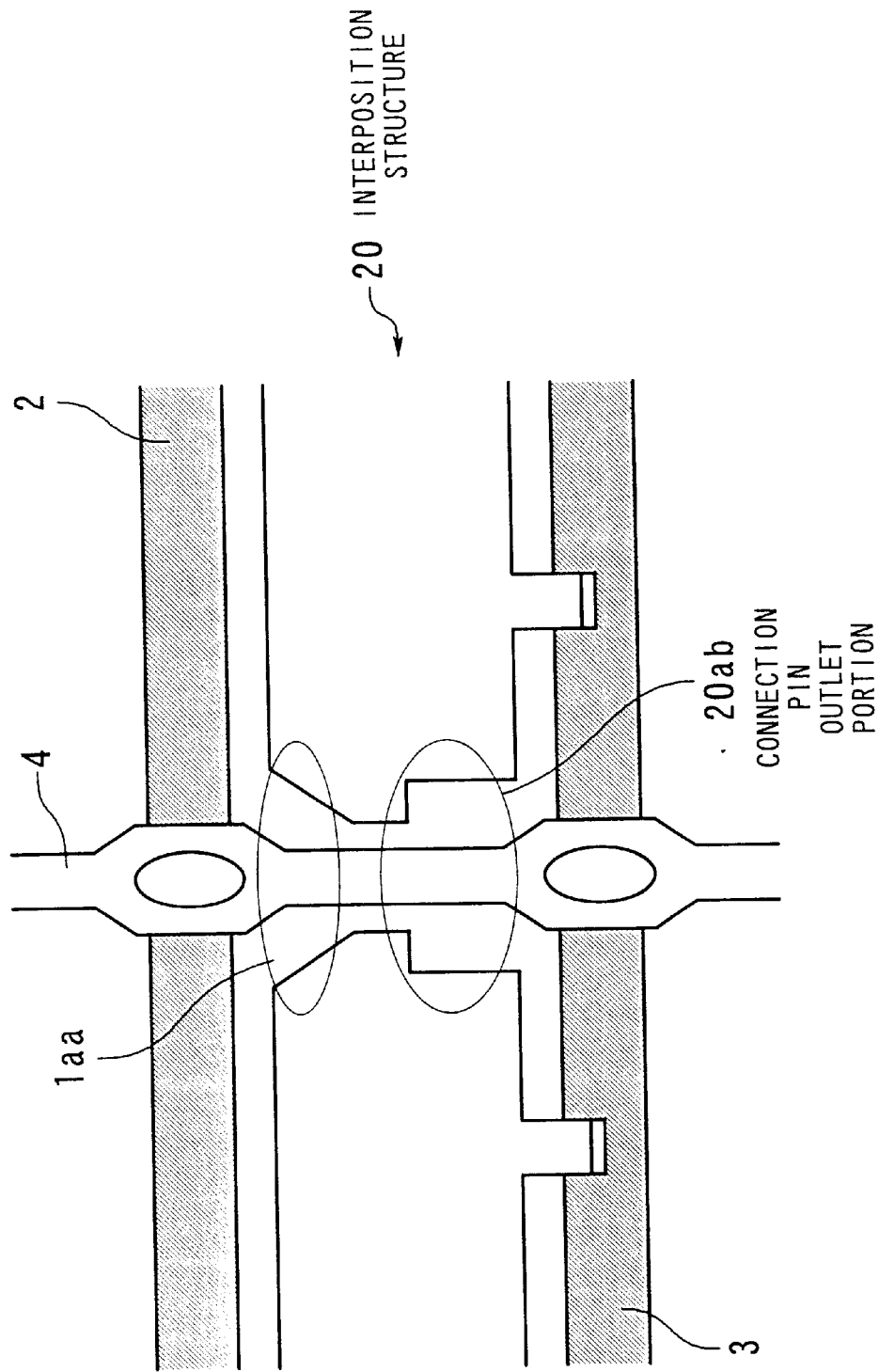
FIG. 15 is a sectional view showing the connection of the upper and lower substrates with the use of an interposition structure.
Figure 16:
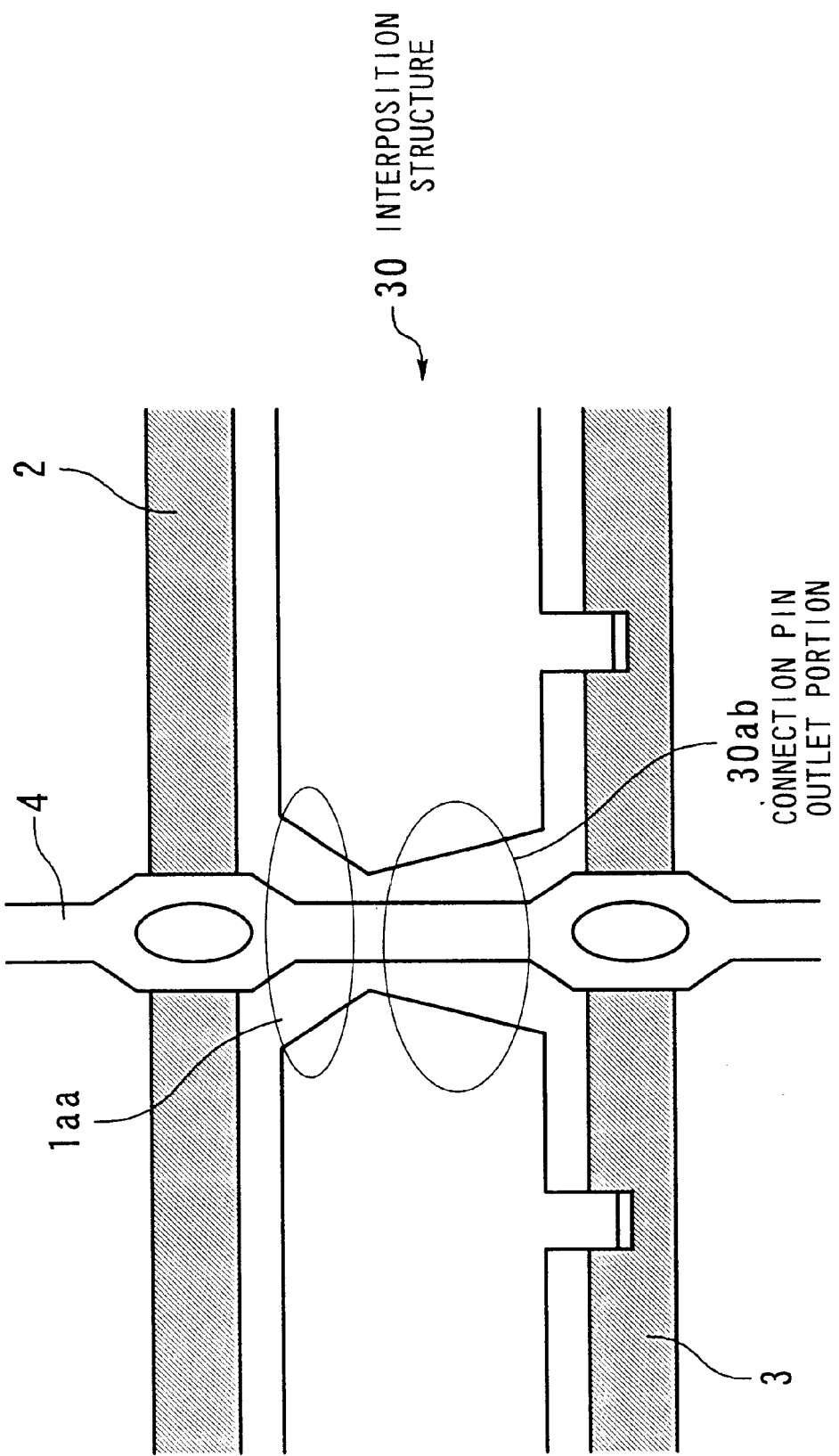
FIG. 16 is a sectional view showing the connection of the upper and lower substrates with the use of an interposition structure.

FIGS. 15 and 16 are sectional views illustrating the connection of the upper and lower substrates 2 and 3 with the use of interposition structures 20 and 30, respectively, according to this embodiment.

As shown in FIG. 15, a connection pin outlet portion 20ab of the interposition structure 20 is formed such that it has a uniformly large inner diameter, compared with that of the central portion of the through hole 1ac. Also with this connection pin outlet portion 20ab, it is possible to obtain the same advantage as achieved by the first embodiment.

A connection pin outlet portion 30ab of the interposition structure 30 shown in FIG. 16 is formed such that the inner diameter thereof gradually increases in a direction from the inner part toward the outer open end of the through hole 1ac, like the first embodiment. The illustrated arrangement differs from the first embodiment in that the inner diameter-enlarged section of the connection pin inlet portion 1aa is contiguous with that of the connection pin outlet portion 30ab. Also with this arrangement, it is possible to obtain the same advantage as achieved by the first embodiment.

A fourth embodiment of the present invention will be now described.

This embodiment is another different form of application of the first embodiment and differs from the first embodiment in that metal plates are incorporated in the interposition structure 1. The following description will therefore be focused on the difference, and explanation of other parts identical with those of the first embodiment will be omitted.

Figure 17:
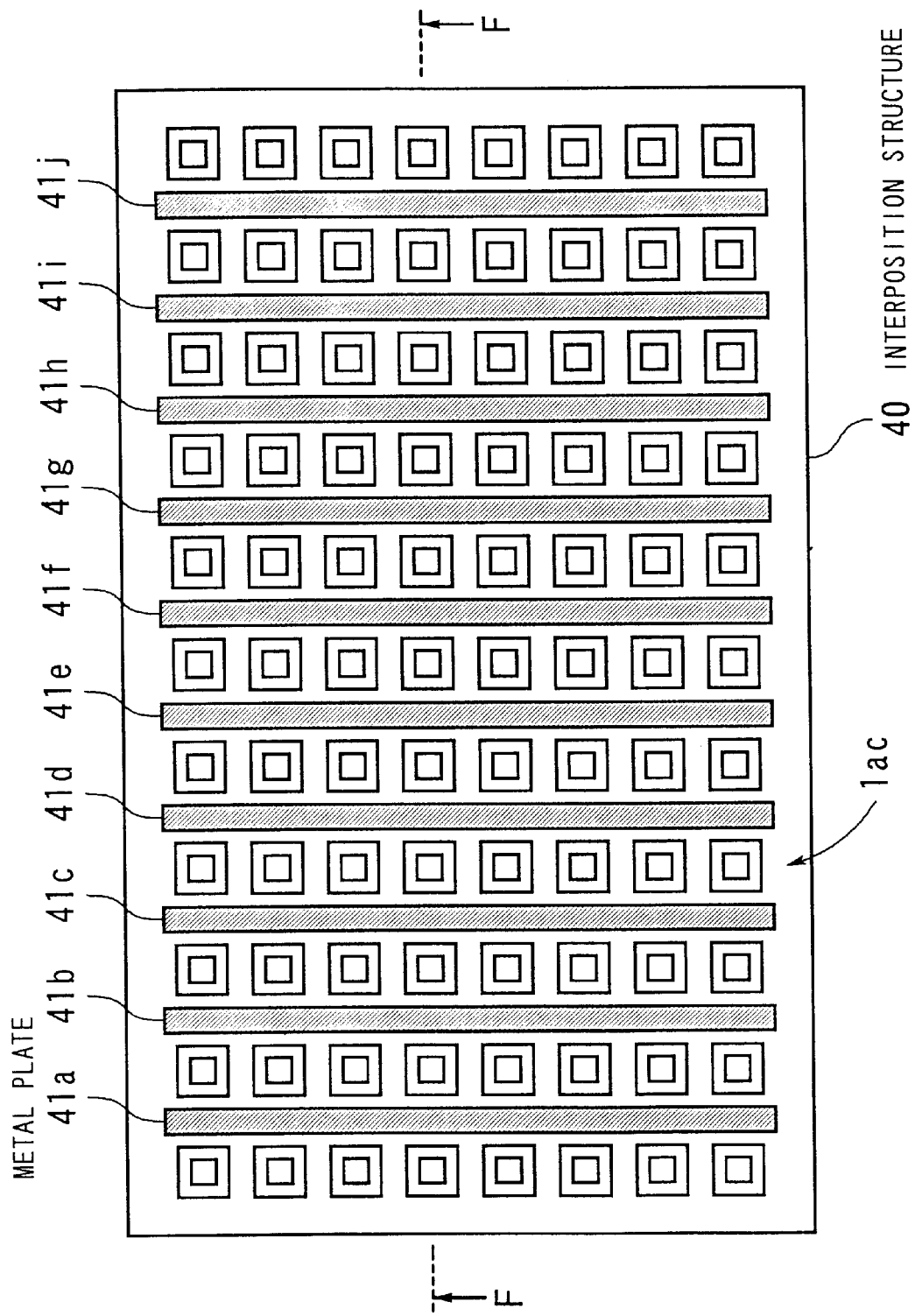
FIG. 17 is a plan view showing an interposition structure.
Figure 18:
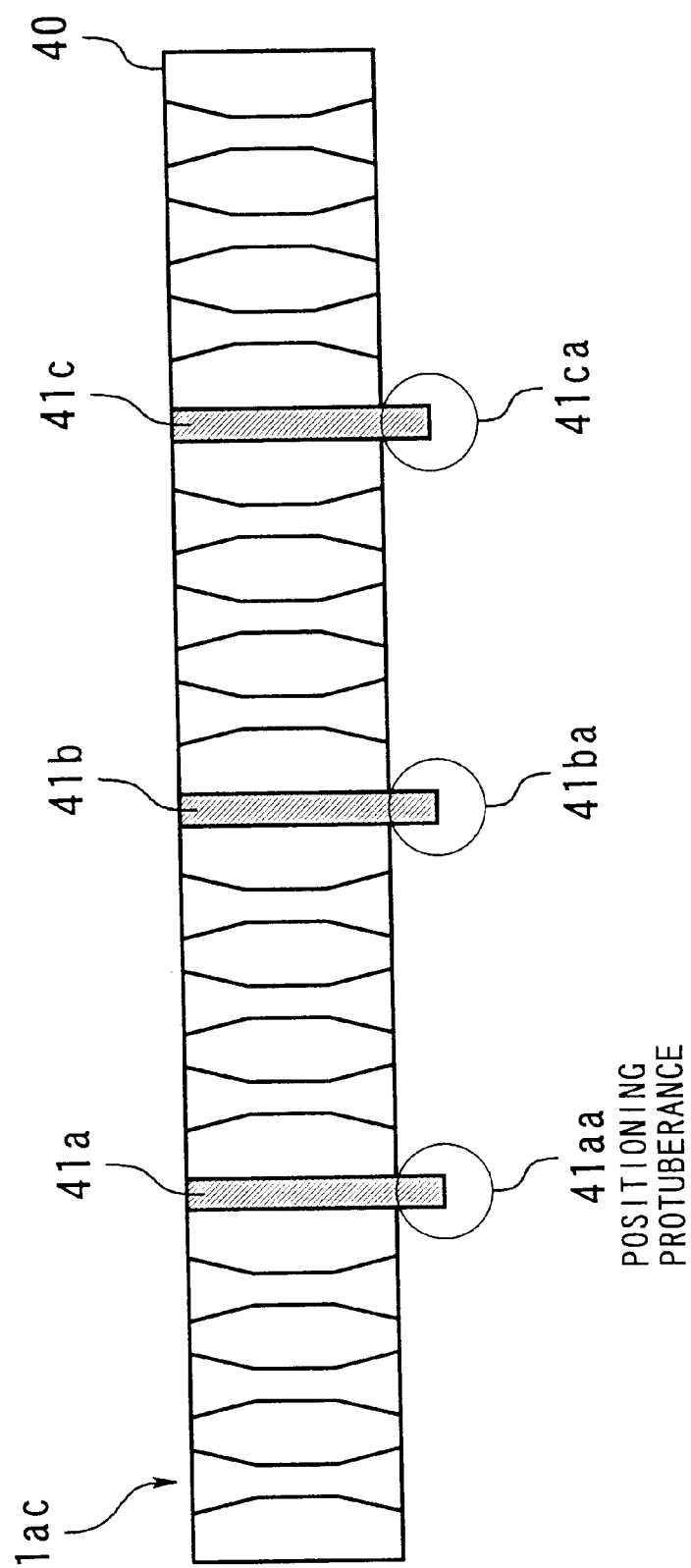
FIG. 18 is a sectional view taken along line F—F in FIG. 17.
Figure 19:
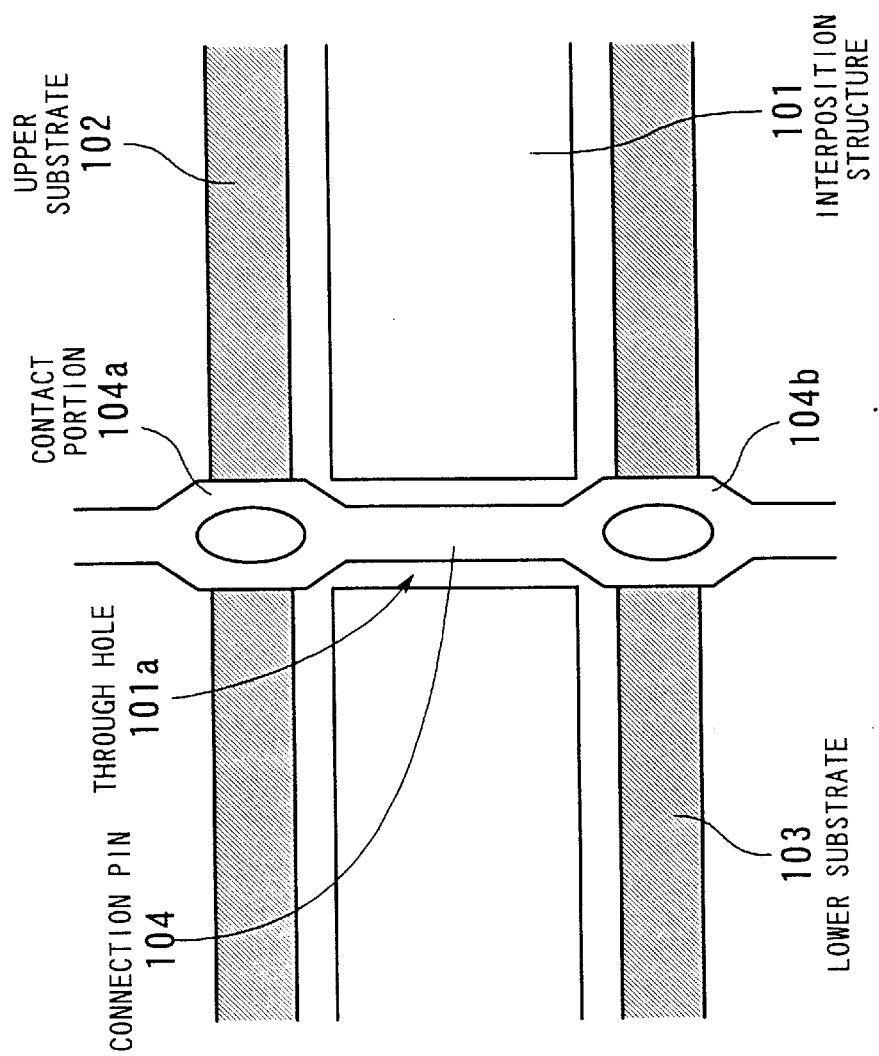
FIG. 19 is a sectional view showing the connection of substrates by a conventional method.

FIG. 17 is a plan view of an interposition structure 40 according to this embodiment, and FIG. 18 is a sectional view taken along line F—F in FIG. 17.

The interposition structure 40 of this embodiment also has a plurality of through holes 1ac formed therein, like the interposition structure 1 of the first embodiment. The through holes 1ac are grouped into predetermined regions which are separated from one another by metal plates 41a to 41j.

The metal plates 41a to 41j each comprise a rectangular plate and are arranged in the plate-like interposition structure 40 perpendicularly thereto such that the through holes 1ac are grouped into the respective regions by the metal plates. Also, as shown in FIG. 18, the metal plates 41a to 41j are each arranged such that part thereof protrudes from the lower surface of the interposition structure 40, and these protuberances respectively function as positioning protuberances 41aa to 41ca. The inner surface of each of the recesses 3a and 3b formed in the upper surface of the lower substrate 3 is electrically connected to a ground, and accordingly, when the positioning protuberances 41aa to 41ca are fitted in the respective recesses 3a and 3b, the positioning protuberances 41aa to 41ca are electrically connected to the ground.

Thus, in this embodiment, the through holes 1ac formed in the interposition structure 40 are grouped into predetermined regions separated by the metal plates 41a to 41j, and the metal plates 41a to 41j are connected to the ground through the positioning protuberances 41aa to 41ca. It is therefore possible to prevent leakage of electromagnetic waves to and from the regions separated by the metal plates 41a to 41j, thus making it possible to reduce noise caused by the leakage of electromagnetic waves.

In this embodiment, portions of the metal plates 41a to 41j are used as the positioning protuberances 41aa to 41ca. Alternatively, the positioning protuberances may each be constituted by a metal pin, and the metal pins constituting the positioning protuberances may be electrically connected to the respective metal plates 41a to 41j.

As described above, according to the present invention, the connection pin inlet portion of each through hole in the interposition body is formed such that the inner diameter thereof gradually increases in a direction from the inner part toward the outer open end thereof, and the positioning protuberances are formed on the lower surface of the interposition body. Thus, even in cases where the substrates to be connected or other members have a dimensional error caused during the production thereof, a positioning error or the like, the connection pins can be inserted properly.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An interposition structure interposed between substrates and capable of guiding insertion of a connection pin for electrically connecting the substrates to each other, comprising:

an interposition body made of an insulating material and having a through hole through which the connection pin is inserted; and a positioning protuberance formed integrally with said interposition body as a one-piece body and formed only on an underside of said interposition body, extending outward from said interposition body and received in a recess formed in an upper surface of a substrate arranged below said interposition body, wherein an opening of the through hole has a connection pin inlet portion from which the connection pin is inserted, and the connection pin inlet portion is formed such that an inner diameter thereof gradually increases in a direction from an inner part toward an outer open end of the through hole, and a central portion of the through hole has an inner diameter thereof narrowed to an extent such that the connection pin can pass there through, at least two contact portions are formed on the connection pin for mounting to the corresponding substrates, each contact portion having a sectional area larger than a sectional area of the connection pin, and said interposition structure is not connected to a substrate arranged above said interposition body.

2. The interposition structure according to claim 1, wherein the opening of the through hole has a connection pin outlet portion from which the connection pin is projected to outside, and the connection pin outlet portion is formed such that an inner diameter thereof is greater than that of the central portion of the through hole.

3. An interposition structure interposed between substrates and capable of guiding insertion of a connection pin for electrically connecting the substrates to each other, comprising:

an interposition body made of an insulating material and having a through hole through which the connection pin is inserted; and a positioning protuberance extending outward from said interposition body and received in a recess formed in one of the substrates, wherein an opening of the through hole has a connection pin inlet portion from which the connection pin is inserted for mounting to the corresponding substrates, and the connection pin inlet portion is formed such that an inner diameter thereof gradually increases in a direction from an inner part toward an outer open end of the through hole, said through hole comprises a plurality of through holes formed in said interposition body, said plurality of through holes are grouped into predetermined regions separated by a metal plate arranged in said interposition body, and said metal plate is electrically connected to a ground, and wherein said positioning protuberance comprises an electric conductor, and said metal plate is electrically connected to the ground through said electric conductor where an inner surface of said recess formed in one of the substrates is electrically connected to the ground.

4. The interposition structure according to claim 3, wherein said positioning protuberance comprises a metal pin attached to said interposition body.

5. An interposition structure interposed between substrates and capable of guiding insertion of a connection pin for electrically connecting the substrates to each other, comprising:

an interposition body made of an insulating material and having a through hole through which the connection pin is inserted; and a positioning protuberance extending outward from said interposition body and received in a recess formed in one of the substrates, wherein an opening of the through hole has a connection pin inlet portion from which the connection pin is inserted, and the connection pin inlet portion is formed such that an inner diameter thereof gradually increases in a direction from an inner part toward an outer open end of the through hole, said positioning protuberance and said interposition body are formed as a one-piece body and provided on a lower surface of said interposition body, said connection pin is pressed-fitted into a hole of an upper substrate and a hole of a lower substrate to connect said upper substrate and said lower substrate for mounting to the corresponding substrates, and a shape of contact portions are larger than other portion in section.

6. The interposition structure according to claim 5, wherein said shape of contact portions are U-Shaped.

* * * * *

UNITED STATES PATENT AND TRADEMARK OFFICE
CERTIFICATE OF CORRECTION

PATENT NO. : 6,428,329 B2
DATED : August 6, 2002
INVENTOR(S) : Kazuya Orui et al.

It is certified that error appears in the above-identified patent and that said Letters Patent is hereby corrected as shown below:

<u>Title page,</u>
Item [73], please add the second and third Assignee: -- Fujitsu Takamisawa Component Limited, Tokyo (JP) and Honda Tsushin Kogyo, Ltd., Tokyo (JP). --

Signed and Sealed this

Twenty-eighth Day of January, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,428,329 B2
DATED         : August 6, 2002
INVENTOR(S)   : Kazuya Orui et al.

It is certified that error appears in the above-identified patent and that said Letters Patent is hereby corrected as shown below:

<u>Title page,</u>
Item [73], please add the second and third Assignee: -- Fujitsu Takamisawa Component Limited, Tokyo (JP) and Honda Tsushin Kogyo Co., Ltd., Tokyo (JP). --

This certificate supersedes Certificate of Correction issued January 28, 2003.

Signed and Sealed this

Thirtieth Day of September, 2003

JAMES E. ROGAN
*Director of the United States Patent and Trademark Office*